United States Patent
Kim et al.

(10) Patent No.: US 8,169,010 B2
(45) Date of Patent: May 1, 2012

(54) LOW-VOLTAGE IMAGE SENSOR WITH SENSING CONTROL UNIT FORMED WITHIN

(75) Inventors: Mi Jin Kim, Daejeon (KR); Bong Ki Mheen, Daejeon (KR); Young Joo Song, Daejeon (KR); Seong Su Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 723 days.

(21) Appl. No.: 11/932,922

(22) Filed: Oct. 31, 2007

(65) Prior Publication Data

US 2008/0111170 A1 May 15, 2008

(30) Foreign Application Priority Data

Nov. 15, 2006 (KR) .................. 10-2006-0112519
Jul. 26, 2007 (KR) .................. 10-2007-0075244

(51) Int. Cl.
*H01L 31/00* (2006.01)
(52) U.S. Cl. .......... 257/292; 257/E21.697; 257/E31.001
(58) Field of Classification Search .................. 257/292, 257/E21.697, E31.001
See application file for complete search history.

(56) References Cited

U.S. PATENT DOCUMENTS

| 2005/0017155 A1 | 1/2005 | Manabe et al. | |
| 2006/0138581 A1* | 6/2006 | Ladd | 257/462 |
| 2007/0114629 A1* | 5/2007 | Dosluoglu et al. | 257/435 |

FOREIGN PATENT DOCUMENTS

| JP | 05-207378 | | 8/1993 |
| JP | 11-168671 | A | 6/1999 |
| JP | 2002-064751 | A | 2/2002 |
| JP | 2003-087663 | | 3/2003 |
| JP | 2004-111590 | A | 4/2004 |
| JP | 2005-323098 | | 11/2005 |
| JP | 2006-278465 | | 10/2006 |
| KR | 10-2001-0057856 | | 7/2001 |
| KR | 10-2001-0086511 | A | 9/2001 |
| KR | 10-2003-0002127 | A | 1/2003 |
| KR | 2007-0064857 | | 6/2007 |
| KR | 2008-0035941 | | 4/2008 |
| WO | WO-2004/044989 | A1 | 5/2004 |

* cited by examiner

*Primary Examiner* — Hung Vu
*Assistant Examiner* — Vernon P Webb
(74) *Attorney, Agent, or Firm* — Rabin & Berdo, P.C.

(57) ABSTRACT

Provided are an image sensor and a method of sensing the same. The image sensor includes: a light receiving device; a signal conversion unit including a transfer transistor having a plurality of transfer gates and for converting photocharges generated by the light receiving device into a voltage to output the voltage; and a sensing control unit for generating at least two reset signals and/or at least two transfer signals applied to the transfer gates of the transfer transistor during a one-time photosensing cycle. The image sensor is obtained by changing the structure and driving method of a transfer transistor of a typical 4-transistor CMOS image sensor and employs a deep depletion operation and a multiple reset operation, thereby reducing an image lag and increasing the well capacity of the light receiving device.

4 Claims, 12 Drawing Sheets

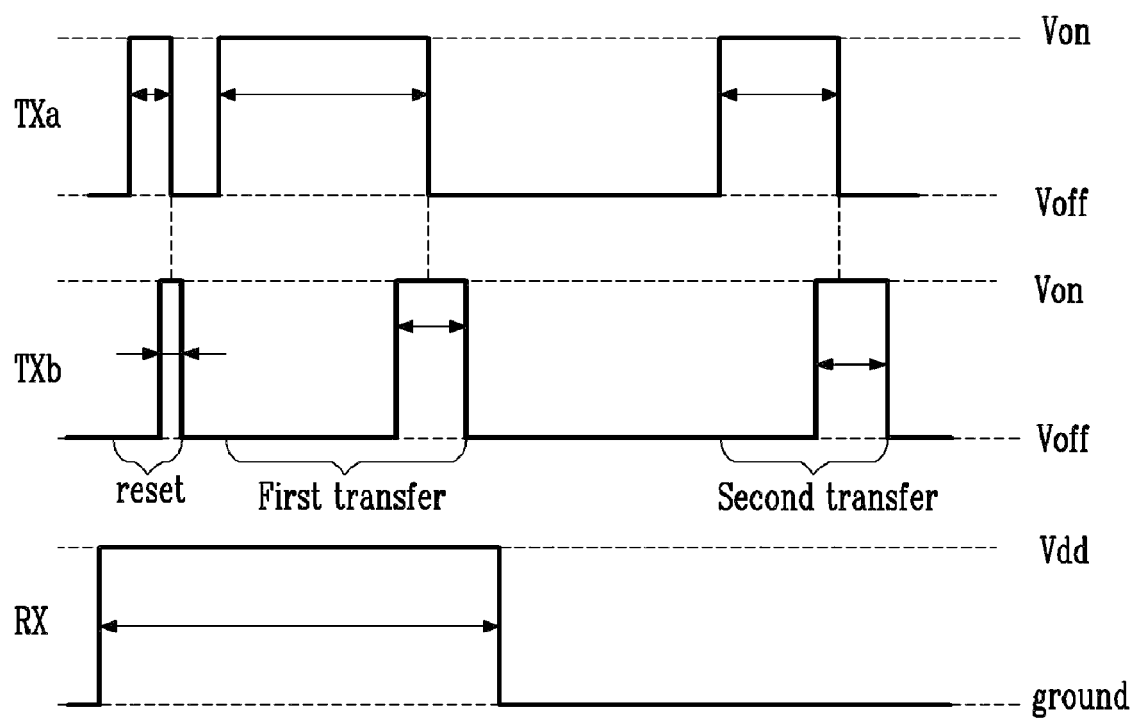

LOW-VOLTAGE IMAGE SENSOR WITH SENSING CONTROL UNIT FORMED WITHIN

CROSS-REFERENCE TO RELATED APPLICATION

This application claims priority to and the benefit of Korean Patent Application No. 2006-112519, filed Nov. 15, 2006, and No. 2007-75244, filed Jul. 26, 2007, the disclosure of which is incorporated herein by reference in its entirety.

BACKGROUND

1. Field of the Invention

The present invention relates to an image sensor and a sensing method thereof and, more specifically, to an image sensor that improves the characteristics of a transfer transistor used during reset and transfer operations of a photodiode, and a sensing method thereof.

The present invention is based on research that has been conducted as part of the Essential Technology Development Enterprise for IT New Growth Power for the Ministry Information and Communication (Republic of Korea) and Institute for Information Technology Advancement (Republic of Korea) [Subject Administration No. 2005-S-017-02, Subject Name: Integrated Development of UltraLow Power RF/HW/SW SoC].

2. Discussion of Related Art

Image sensors may be largely divided into charge-coupled device (CCD) sensors and complementary metal-oxide-semiconductor (CMOS) sensors. Both the CCD sensors and CMOS sensors operate using electron-hole pairs generated by light having a higher energy than a silicon band-gap. In this case, a technique for estimating the quantity of light irradiated by collecting electrons or holes is being employed.

In a CMOS image sensor, each image pixel includes a photodiode and a transistor similar to a typical CMOS device, so that conventional CMOS semiconductor fabrication processes can be used without changes. Therefore, as compared with a CCD image sensor that requires an additional chip having an image signal processor, the CMOS image sensor may integrally integrate an image signal processing circuit and an image detection circuit in a block outside a pixel, operate at a low voltage, and be fabricated at low cost.

Conventional CMOS image sensors may be classified into a 4-transistor pixel structure and a 3-transistor pixel structure according to the number of transistors forming a single pixel. The 3-transistor pixel structure is better than the 4-transistor pixel structure in terms of a fill factor and fabrication cost. However, the 4-transistor pixel structure is typically used because a light receiving unit, except for a surface thereof, is separated from a light detection unit and formed by a silicon bulk so that the 4-transistor pixel structure is highly responsive and sensitive to light and highly resistant to dark current and noise.

A conventional 4-transistor CMOS image sensor is illustrated in FIG. 1. In the 4-transistor CMOS image sensor, a unit pixel includes a photodiode PD, which is a light sensor, and four NMOS transistors, namely, a transfer transistor Tx, a reset transistor Rx, a drive transistor Dx, and a switch transistor Sx. The transfer transistor Tx transfers photocharges generated by the photodiode PD to a diffusion node region FD. The reset transistor Rx discharges charges stored in the diffusion node region FD or the photodiode PD in order to detect signals. The drive transistor Dx functions as a source follower transistor. The switch transistor Sx is used for switching and addressing operations.

The photodiode PD and a capacitor 118, which are connected in parallel, constitute a light receiving unit, and the transfer transistor Tx transfers electrons generated due to photons to a diffusion node 131. In order to obtain a 2-dimensional image, a voltage is applied through a gate 141 of the switch transistor Sx to select one column. In particular, each pixel is biased by a current source 150, which operates the drive transistor Dx and the switch transistor Sx so as to read the voltage of the diffusion node 131 via an output node 142.

FIG. 2A is a cross-sectional view of a photodiode region and a transfer transistor including a diffusion node of a conventional 4-transistor CMOS image sensor. An n-doping region 202 having a specific concentration and a $p^+$ region 203 used for surface pinning are formed in a p-type substrate 201 and constitute a photodiode, which is a light receiving device. Also, a gate insulating layer 205, a gate electrode material 206, a control line 210, and a sidewall insulating layer 207 are formed on the p-type substrate 201 and constitute a transfer transistor, which is used to reset an n-doping region 202 where photocharges are generated and accumulated, and transfer the photocharges. In this case, a diffusion node 204a and 204b, which is used to convert photocharges into a voltage, may include a diffusion region 204a so that the diffusion node 204a and 204b can be self-aligned with the gate electrode material 204 of the transfer transistor. Here, the diffusion region 204a may be formed by doping n-type impurities before forming the sidewall insulating layer 207.

FIG. 2B is a timing diagram illustrating a method of driving transfer and reset transistors Tx and Rx to perform reset and transfer operations of a photodiode in a conventional 4-transistor image sensor. Typically, a power supply voltage Vdd is used to turn on the transfer and reset transistors Tx and Rx, and a ground voltage is used to turn off the transfer and reset transistors Tx and Rx. When the reset transistor Rx is turned on (i.e., a period 231), during a turning-on period 232 of the transfer transistor Tx, a low impedance is maintained between the photodiode and a drain of the reset transistor Rx, so that charges accumulated in the photodiode are emitted out of a pixel to reset the photodiode. After resetting the photodiode, a diffusion node is reset during a turning-on period 235 of the reset transistor Rx. Thus, the voltage of the diffusion node is clamped at a voltage obtained by subtracting a sub-threshold voltage Vth of the reset transistor Rx from the power supply voltage Vdd. After finishing the reset of the photodiode (i.e., the period 232), photocharges are accumulated in the photodiode during an integration time 236 in which the photodiode receives light to generate and accumulate photocharges, transferred to the diffusion node constituting a source follower during a turning-on period 233 of the transfer transistor Tx, and finally applied as a voltage to an external circuit. In this case, the intensity of light is detected by a voltage drop of the diffusion node measured at an output node after the transfer period 233 of the photocharges based on the voltage of the diffusion node measured at the output node after the reset period 235 of the diffusion node.

Therefore, the 4-transistor pixel CMOS image sensor transfers photogenerated carriers, which are accumulated in the photodiode after the reset period of the photodiode, to a floating diffusion node so that the amount of the photogenerated carriers is detected by the voltage drop of the diffusion node. In this case, the transfer transistor should perform constant, uniform reset and transfer operations in order to precisely and uniformly detect the amount of the accumulated photogenerated carriers.

Conventional 4-transistor pixels having various structures, for example, a complete-reset pinned photodiode, have been disclosed to allow a transfer transistor to perform constant reset and transfer operations. The complete-reset pinned photodiode refers to a photodiode in which all mobile charges accumulated therein are completely depleted during the reset of the photodiode and no further change in voltage occurs. In this case, the voltage of a photodiode is ideally always pinned at a constant voltage irrespective of external bias environment, such as the voltage of a floating diffusion node. Thus, the transfer operation is always performed under constant reset and transfer conditions, and the reset operation is performed under the same conditions as the transfer operation.

However, the electric potential of a diffusion node has gradually decreased in order to downscale semiconductor devices and reduce power consumption. With a reduction of the electric potential of the diffusion node, when a complete-reset pinned photodiode is used, the pinning electric potential of the pinned photodiode is naturally reduced. In this case, the characteristics of a pixel, such as well capacity or the responsivity of a photodiode to light, may deteriorate and fixed pattern noise may increase. As a result, even if an operating voltage is reduced, there is a specific limit to reducing the pinning electric potential.

When employing an incomplete-reset pinned photodiode in which mobile charges remain after reset and transfer operations of the photodiode, charges are emitted from the diffusion node to a channel region of the transfer transistor so that reset and transfer conditions of the photodiode are changed, a dark current characteristic and a fixed pattern noise characteristic are degraded, and the characteristics of an image sensor becomes very sensitive to process variables.

Above all, irrespective of whether a photodiode is a complete-reset pinned photodiode or an incomplete-reset pinned photodiode, although a power supply voltage Vdd decreases, the concentration of the $p^+$ region 203 (refer to FIG. 2A) for surface pinning of the photodiode cannot be reduced. Because of the $p^+$ region 203 formed in an upper portion of the photodiode, a predetermined potential barrier is necessarily present between the n-doping region 202 (refer to FIG. 2A) in which photocharges are generated and accumulated, and the channel region of the transfer transistor. In this case, when the power supply voltage Vdd decreases, the potential barrier causes a more serious problem.

When the potential barrier is not sufficiently reduced, even if the pinning voltage of the photodiode is very low, the photodiode is not completely reset, and the amount of charges remaining in the photodiode is determined by the potential barrier during a transfer operation, thereby degrading the photocharge transfer efficiency of the transfer transistor. Furthermore, the influence of the potential barrier on the transfer operation depends on the amount of photocharges accumulated in the photodiode, thereby causing an image lag.

SUMMARY OF THE INVENTION

The present invention is directed to an image sensor which inhibits an image lag at a low operating voltage and has an improved dynamic range, and a method of driving a transfer transistor thereof.

Specifically, the present invention is directed to an image sensor in which a transfer transistor of a multiple transfer gate can effectively inhibit a potential barrier irrespective of the amount of photocharges accumulated in a light receiving device so as to inhibit an image lag and improve a dynamic range, and a method of sensing the same.

To achieve the above-described objects, the present invention provides an image sensor including a transfer transistor having a plurality of gates. In the image sensor, the gates are driven using a multiple reset operation or a multiple transfer operation in order to exclude the influence of the amount of photocharges of a diffusion node.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 10A through 10C are timing diagrams illustrating a method of driving a transfer transistor according to another exemplary embodiment of the present invention.

DETAILED DESCRIPTION OF EMBODIMENTS

Figure 1:
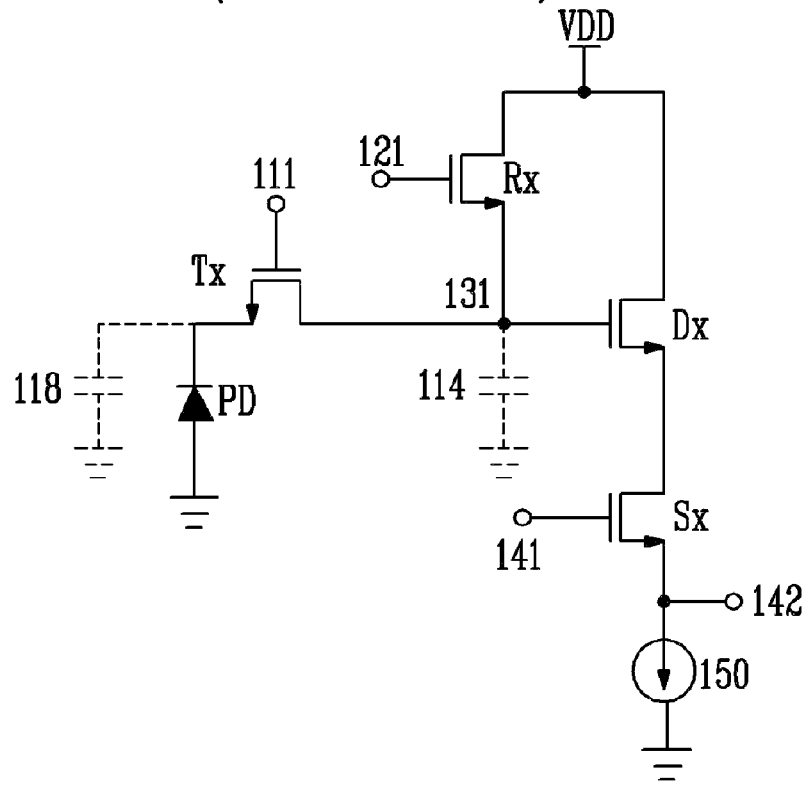
FIG. 1 is a circuit diagram of a conventional 4-transistor CMOS image sensor.
Figure 2A:
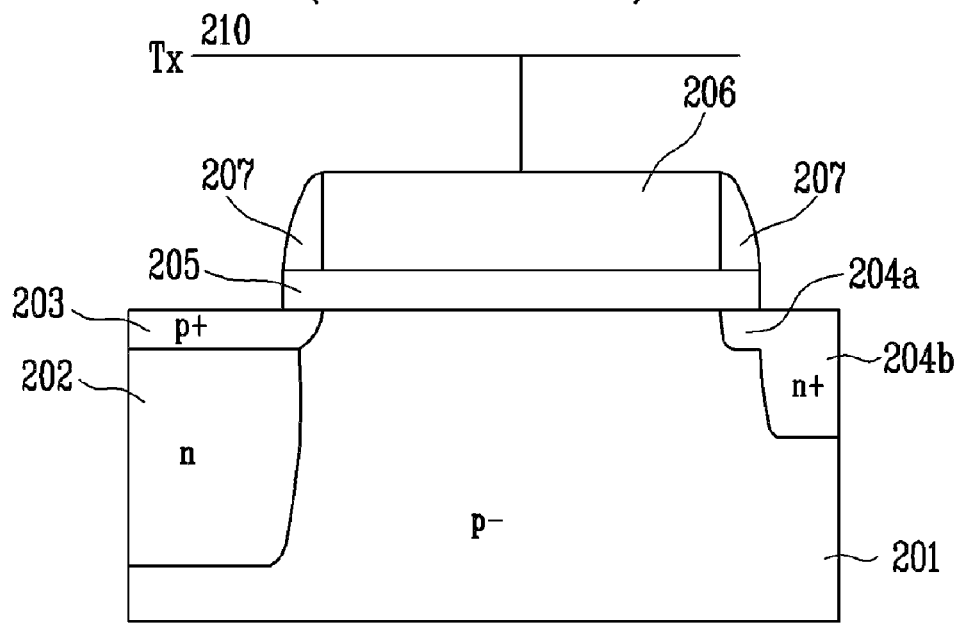
FIG. 2A is a cross-sectional view of a photodiode and a transfer transistor of a conventional 4-transistor CMOS image sensor.
Figure 2B:
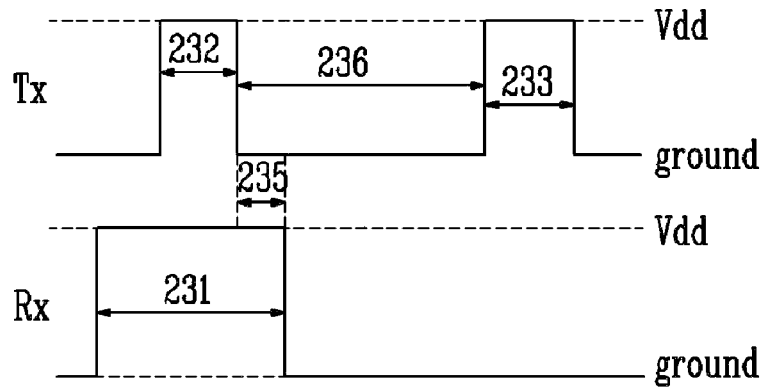
FIG. 2B is a timing diagram illustrating a method of driving reset and transfer transistors of a photodiode in a conventional 4-transistor image sensor.

Like a typical image sensor, an image sensor according to the present invention includes: a light receiving device; a signal conversion unit which converts photocharges generated by the light receiving device into a voltage and outputs the voltage; and a sensing control unit, which controls the drive of the image sensor.

The light receiving device is not restricted to any specific structure and may be a device including a depletion region in which photocharges can be generated due to light and accumulated. For example, the light receiving device may be a photodiode, a pinned photodiode, a phototransistor, or a photogate.

The signal conversion unit converts the photocharges generated and accumulated in the light receiving device into a voltage and outputs the voltage. The signal conversion unit includes a transfer transistor, a reset transistor, a drive transistor, and a select transistor. Also, a transfer transistor and a reset transistor may be embodied by a single transistor according to the structure of the image sensor.

The transfer transistor controls the transfer of photocharges generated and accumulated in the light receiving device to a diffusion node, which is a charge storage region. The reset transistor removes signal charges from the diffusion node to initialize the diffusion node. The drive transistor may function as a source follower of which a gate is electrically connected to the diffusion node to provide an electric potential corresponding to the photocharges transferred to the diffusion node. The switch transistor may control application of the electric potential provided by the drive transistor.

The sensing control unit may include a timing control circuit, which controls the timing of the drive of the signal conversion unit, and an electric potential regulation circuit, which regulates turn-on and turn-off voltage levels of the transfer transistor and/or the reset transistor, the drive transistor, and the switch transistor.

First, a multiple gate structure will now be described. In the present invention, "multiple gate structure" means a structure including at least two gates.

The multiple gate structure may meet two opposing conditions, specifically, a condition where the turn-on voltage of a transfer transistor should be lowered to exclude the influence of a diffusion node during reset and transfer operations of a light receiving device, and a condition where the turn-on voltage of the transfer transistor should be elevated to increase the well capacity of the light receiving device and perform effective reset and transfer operations. That is, even in an image sensor including the transfer transistor with the multiple gate structure, a potential barrier varies with the amount of photocharges accumulated in the light receiving device during reset and transfer operations, and thus an image lag occurs.

In the multiple gate structure that can exclude the influence of the diffusion node and elevate the turn-on voltage of the transfer transistor, in order to prevent an image lag and increase the well capacity of the light receiving device, a channel of the transfer transistor should be always in a constant deep depletion state irrespective of the amount of photocharges accumulated in the light receiving device during the transfer and reset operations of the light receiving device.

The above-described principle will now be described in detail. When a turn-on voltage is applied to a transfer gate adjacent to the light receiving device during reset and transfer operations of the light receiving device, a lower structure of the transfer gate transfers photocharges from the light receiving device to a channel in a constant deep depletion state, and the channel holds equilibrium channel charges or is in a weak deep depletion state according to the amount of the photocharges transferred from the light receiving device to the channel and captures photocharges therein.

Hereinafter, the occurrence of an image lag in an image sensor having a transfer transistor with a multiple gate structure will be described with reference to FIGS. 3A through 3D.

FIGS. 3A through 3D are diagrams showing the electric potentials of a gate electrode material, a gate oxide layer, a channel region, and a substrate relative to the amount of photocharges transferred from a light receiving device to a channel region of a transfer gate.

Figure 3:
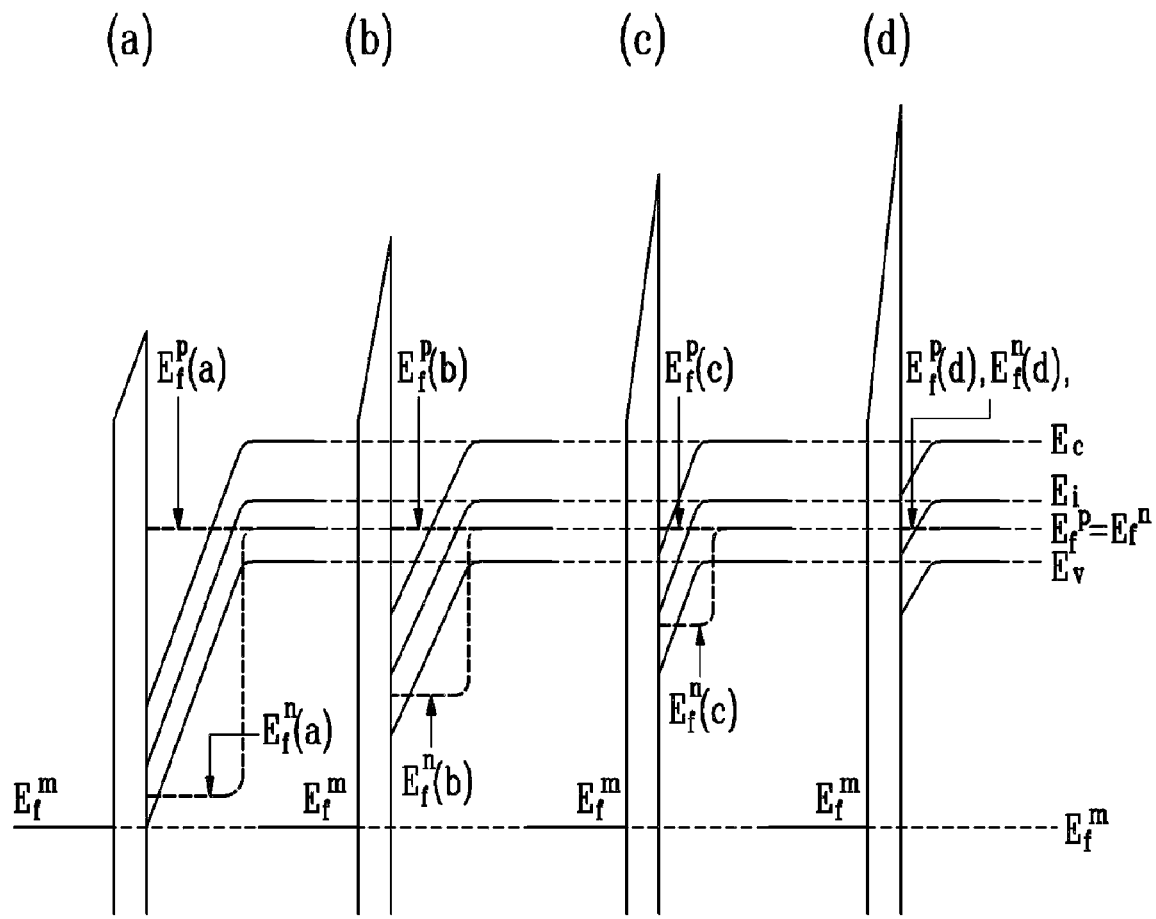
FIGS. 3A through 3D are potential diagrams of a gate electrode material, a gate oxide layer, a channel region, and a substrate.

Referring to FIG. 3A, when the amount of photocharges accumulated in the light receiving device is small, the channel region is in a very deep depletion state. As the potential of the channel region is reduced by the deep depletion state, a potential barrier present between the light receiving device and the channel is effectively inhibited.

When the amount of photocharges accumulated in the light receiving device is increased and a larger amount of photocharges are emitted to the channel region of the transfer gate, the potential of the channel region passes through the states shown in FIGS. 3B and 3C, and then reaches the state shown in FIG. 3D when the channel region of the transfer gate is in equilibrium (Q1).

In the transfer transistor with the multiple gate structure, the amount Q1 of equilibrium channel charges of the transfer gate disposed adjacent to the light receiving device is smaller than the maximum amount Qwc of charges that can be accumulated in the light receiving device, the amount of mobile charges remaining in the light receiving device after reset or transfer operations is determined by the amount Q1 of the equilibrium channel charges. Therefore, the amount Q1 of the equilibrium channel charges of the transfer gate adjacent to the light receiving device should be larger than the maximum amount Qwc of charges that can be accumulated in the light receiving device.

Accordingly, when a small amount of charges are transferred from the light receiving device to the channel of the transfer gate that is closest to the light receiving device (i.e., when light does not exist), the potential of the channel region of the transfer gate is as shown in FIG. 3A. Also, when the maximum amount Qwc of charges are transferred to the channel region, the potential of the channel region is as shown in FIG. 3C.

A difference ($E_f^p - E_f^n$) between a Fermi level $E_f^n$ of an electron and a Fermi level $E_f^p$ of a hole, which is shown in FIGS. 3A through 3D, is caused by the deep depletion of the channel region and has substantially the same effect as an increase in the turn-on voltage applied to the transfer gate. As a result, the potential barrier present between the light receiving device and the channel region of the transfer gate can be effectively inhibited, thereby increasing the well capacity of the light receiving device.

However, the difference ($E_f^p(a) - E_f^n(a)$) and ($E_f^p(c) - E_f^n(c)$) between the Fermi level $E_f^n$ of the electron and the Fermi level $E_f^p$ of the hole varies with the amount of photocharges transferred from the light receiving device to the channel region of the transfer gate as shown in FIGS. 3A through 3C, so that an image lag occurs.

In the present invention, in order to remove the image lag from the image sensor having the transfer transistor with the multiple gate structure, a method of multiple-resetting or multiple-transferring the transfer transistor with the multiple gate structure is proposed. Thus, the potential of the transfer gate adjacent to the light receiving device is maintained as shown in FIG. 3A during reset or transfer operations irrespective of the amount of photocharges accumulated in the light receiving device, thereby inhibiting the potential barrier.

An image sensor according to the present invention includes a light receiving device, a transfer transistor with a multiple gate structure, a signal conversion unit, which converts photocharges generated by the light receiving unit into a voltage and outputs the voltage, and a sensing control unit, which applies a reset signal and/or a transfer signal at least twice to a gate of the transfer transistor during a one-time photosensing cycle.

Here, a sensing method performed by the sensing control unit of the CMOS image sensor during a one-time sensing cycle includes: resetting the light receiving device of the CMOS image sensor; condensing light into the light receiving device; and transferring photocharges generated by the light receiving device to a diffusion node. The sensing method is characterized by performing the reset operation twice or more and/or performing the transfer operation twice or more.

The present invention will now be described more fully hereinafter with reference to the accompanying drawings, in which exemplary embodiments of the invention are shown. This invention may, however, be embodied in different forms and should not be construed as limited to the embodiments set forth herein.

For example, the following embodiments of the present invention describe a light receiving device embodied by a pinned photodiode and a signal conversion unit embodied by four transistors by applying a photosensitive pixel according to the present invention to a 4-transistor CMOS image sensor. However, the present invention is not limited thereto and can be applied to other image sensors including other kinds of light receiving devices and transistors for transferring photocharges generated by the light receiving devices. For instance, the present invention can be applied to a CCD sense circuit having a low-voltage output terminal.

Further, for brevity, the following embodiments of the present invention describe only methods of driving transfer transistors with double or triple gate structures. However, the present invention is not limited thereto, and structures and driving methods according to the present invention can be applied to transfer transistors with four or more gates without departing from the spirit and scope of the invention.

Structurally, a driving method according to the present invention can be applied to a transfer transistor with a multiple gate structure. Although cross-sectional views simplify a lower structure interposed between a diffusion node and a transfer gate for brevity, even if there is a change in a material for a gate sidewall insulating layer or in its forming process, a change in the dopant concentration or structure of the diffusion node, the presence or absence of an expansion region, or changes in processes for forming gates of the transfer transistor, desired results can be obtained by applying a method of driving an image sensor according to the present invention. Therefore, it is clear that multiple-gate transfer transistors with various structures formed using various processes can produce expected results using the driving method according to the present invention.

Although it is described and illustrated that a substrate and a doping region disposed on a photodiode are doped with p-type impurities, and a diffusion node and the photodiode are doped with n-type impurities, the present invention is not limited thereto. Thus, the substrate and the doping region disposed on the photodiode may be doped with p-type impurities and the diffusion node and the photodiode may be doped with n-type impurities.

Like reference numerals and characters in the timing diagrams denote like operations.

Embodiment 1

An image sensor according to an exemplary embodiment of the present invention, includes a photodiode, a photosensitive pixel including a transfer transistor for transferring photocharges generated by the photodiode to a diffusion node, and a sensing control unit functioning as a driving/control circuit for controlling the voltage application time, voltage elimination time, voltage maintaining time, and applied voltage of each of transfer gates of the transfer transistor.

In the present embodiment, the transfer transistor to which the scope of the present invention can be applied includes three transfer gates. To facilitate understanding, FIG. 4 illustrates a cross-section of a transfer transistor including three transfer gates, a photodiode, and a diffusion node region according to an exemplary embodiment of the present invention.

Figure 4:
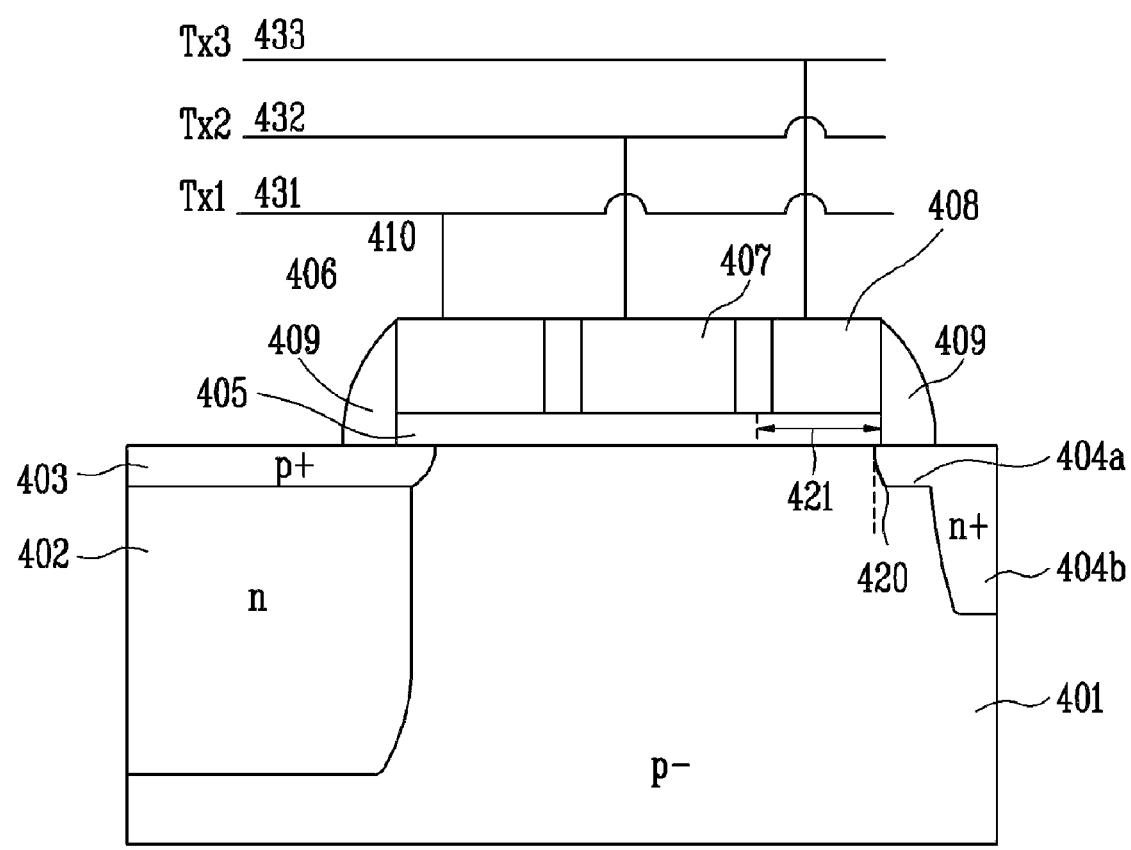
FIG. 4 is a cross-sectional view of a photodiode and a transfer transistor of a CMOS image sensor according to an exemplary embodiment of the present invention.

Referring to FIG. 4, the transfer transistor includes three gate electrodes 406, 407, and 408, which are electrically insulated from one another, a gate insulating layer 405, and a substrate 401 that is lightly and uniformly doped with p-type impurities. The photodiode includes an n-type doping region 402 in which photocharges are accumulated and a $p^+$ surface doping region 403, which is doped at a higher concentration than a substrate.

Three transfer gates that form the transfer transistor are embodied by the gate electrodes 406, 407, and 408, an insulating material 410, which is used to electrically insulate the gate electrodes 406, 407, and 408 from one another, and the gate insulating layer 405. Control lines 431, 432, and 433 are connected to the gate electrodes 406, 407, and 408, respectively, to apply turn-on and turn-off voltages. Hereinafter, to explain the three transfer gates formed of the foregoing materials with the foregoing structures and turn-on and turn-off voltages, a transfer gate closest to the photodiode, a transfer gate second closest to the photodiode, and a transfer gate farthest from the photodiode will be referred to as first through third transfer gates Tx1, Tx2, and Tx3, respectively.

The sensing control unit may further include a timing control circuit for controlling times taken to apply turn-on or turn-off voltages to the control lines 431, 432, and 433 or times taken to maintain the applications of the turn-on or turn-off voltages, a switching device for switching on and off the connection of voltages, and an electric potential regulation circuit for regulating the levels of the turn-on and turn-off voltages.

In FIG. 4, the first transfer gate Tx1 is used to emit photocharges accumulated in the photodiode to a portion disposed under the gate insulating layer 405 of the first transfer gate Tx1. The second transfer gate Tx2 captures signal charges in a portion disposed under the gate insulating layer 405 of the second transfer gate Tx2 so that a high impedance can be maintained between the diffusion node and the photodiode without loss of signal charges. The third transfer gate Tx3 is used to transfer the signal charges captured in the second transfer gate Tx2 to the diffusion node. In particular, when photocharges are transferred from the photodiode to the first transfer gate Tx1, the third transfer gate Tx3 remains turned off to exclude the influence of the diffusion node.

More specifically, during reset or transfer operation, after a turn-off voltage is applied to the first transfer gate Tx1, a turn-on voltage is applied to the third transfer gate Tx3. Thus, signal charges, which are transferred from a channel region of the first transfer gate Tx1 and captured in the second transfer gate Tx2, are transferred to the diffusion node. Therefore, when photocharges are emitted from the photodiode to a channel disposed under the transfer transistor, a high impedance is maintained between the diffusion node and the channel, so that the photocharges are not emitted from the diffusion node to the channel. Also, when signal charges are transferred from the channel to the diffusion node, a high impedance is maintained between the photodiode and the channel, and thus reset and transfer characteristics can be always uniform.

Here, the third transfer gate Tx and the diffusion node may be embodied by a typical structure having source and drain regions disposed under a sidewall insulating layer 409. Alternatively, the entire area of the transfer transistor may be reduced or the third transfer gate Tx may partially overlap the diffusion node, so that uniform reset and transfer characteristics can be obtained. When the transfer gate Tx partially overlaps the diffusion node, a turn-off voltage may be applied from the third transfer gate Tx3 through a parasitic capacitor to the diffusion node. The above-described structures can prevent the emission of charges from the diffusion node.

That is, even if there is a change in a material of the sidewall insulating layer 409 or its forming process, a change in the dopant concentration or structure of the diffusion node, the presence or absence of expansion regions, the overlapping of a transfer gate and the diffusion node, the overlapping of transfer gates, or structural changes, desired results proposed by the present invention can be obtained.

However, when the transfer gate Tx overlaps the diffusion node, a boundary region 420 between the diffusion node and the substrate 401 should be inside a region 421 where no instantaneous emission of charges from the diffusion node to a region disposed under a channel of the second transfer gate Tx2 occurs due to an edge effect when a turn-off voltage is applied to the third transfer gate Tx3 and a turn-on voltage is applied to the second transfer gate Tx2.

Figure 5A:
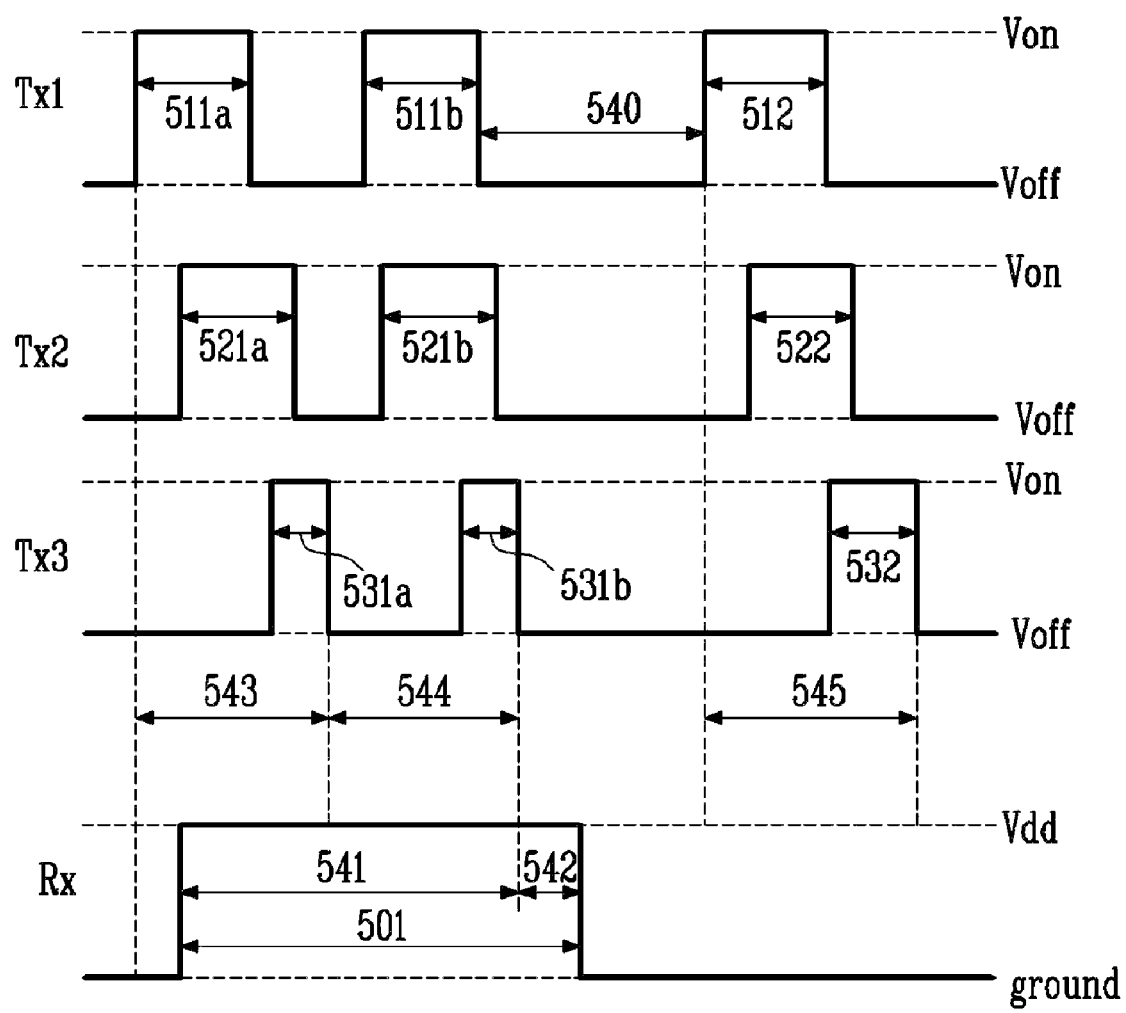
FIGS. 5A through 5C are timing diagrams illustrating a method of driving a transfer transistor according to an exemplary embodiment of the present invention.

FIG. 5A is a timing diagram illustrating a method of driving the transfer gates Tx1, Tx2, and Tx3 and the reset transistor Rx of the transfer transistor shown in FIG. 4 during reset and transfer operations of the photodiode, according to an exemplary embodiment of the present invention.

As described above, the first transfer gate Tx1 is a transfer gate closest to the photodiode, the third transfer gate Tx3 is a transfer gate closest to the diffusion node, and the second transfer gate Tx2 is a transfer gate interposed between the first and third transfer gates Tx1 and Tx3.

Referring to FIG. 5A, the timing diagram may be divided into a photodiode reset period 541, a diffusion node reset period 542, an integration time 540 during which charges are accumulated due to light, and a transfer period 545 during which photocharges accumulated in the photodiode are transferred to the diffusion node.

After the diffusion node reset period 542 and after the transfer period 545, a correlated double sampling (CDS) read period may be added. The CDS read period may correspond to a period during which diffusion nodes of respective pixels are sequentially read, and be shorter than the integration time 540. Since the transfer gates Tx1, Tx2, and Tx3 and the reset transistor Rx do not operate during the CDS read period, the CDS read period is not illustrated in FIG. 5A.

The first through third transfer gates Tx1, Tx2, and Tx3 are sequentially turned on in response to a reset signal during each of reset periods 543 and 544. According to the present invention, the reset operation is performed twice during a one-time photosensing cycle.

When a large amount of photocharges are accumulated in the photodiode in a first reset period 543, the potential of a channel region approximates that shown in FIG. 3D during turn-on periods 511a and 521a of the first and second transfer gates Tx1 and Tx2. Thus, when a turn-off voltage is applied to the first transfer gate Tx1, a predetermined amount of charges remain in the photodiode and a high impedance occurs between the photodiode and the diffusion node. Thereafter, when the third transfer gate Tx3 is turned on during a period 531a, photocharges, which are transferred from the photodiode to the channel region of the transfer gate Tx3 and captured in the channel region, are transferred to the diffusion node and finally emitted out of the pixel through a channel of the reset transistor Rx.

When a small amount of photocharges are accumulated in the photodiode in the first reset period 543, the potential of the channel region approximates that shown in FIG. 3B during the turn-on periods 511a and 521a of the first and second transfer gates Tx1 and Tx2. Thus, when a turn-on voltage is applied to the first transfer gate Tx1 and/or the second transfer gate Tx2, a potential barrier is effectively inhibited, so that mobile charges do not remain in the photodiode or only a small amount of charges remains therein.

Therefore, irrespective of the amount of the charges accumulated in the photodiode before the reset operation, only a small constant amount of photocharges can be transferred from the photodiode to the channel region of the first transfer gate Tx1 or the second transfer gate Tx2 during a second reset period 544. As a result, the potential of the channel region approximates that shown in FIG. 3A during turn-on periods 511b and 521b of the first and second transfer gates Tx1 and Tx2, so that the photodiode can be reset more effectively and an image lag can be prevented.

Figure 5B:
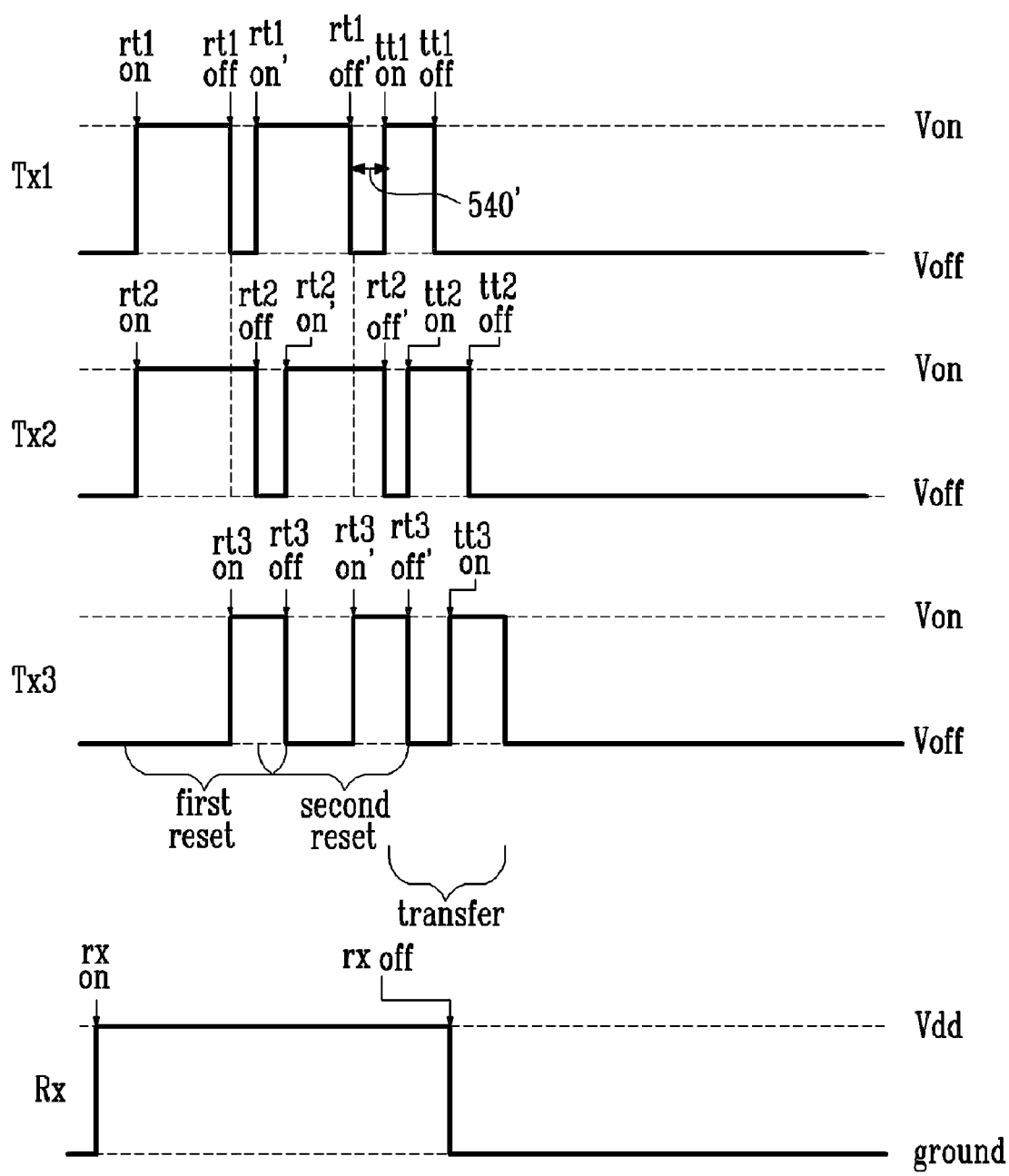

FIG. 5B is a timing diagram illustrating a method of driving the transfer gates Tx1, Tx2, and Tx3 and the reset transistor Rx of the transfer transistor shown in FIG. 4 under conditions where a reset period of the photodiode and/or an integration time can be shortened.

That is, FIG. 5B illustrates a method of driving the three transfer gates Tx1, Tx2, and Tx3 to allow partial overlapping of signals applied to different transfer gates during each of reset and transfer periods.

Basic driving conditions where the three transfer gates Tx1, Tx2, and Tx3 perform reset or transfer operations are as follows. In order to shorten a time taken for the reset operation and effectively reset the photodiode, a time point "rxon" at which a turn-on voltage is applied to the reset transistor should precede a time point "rt3on" at which a turn-on voltage is applied to the third transfer gate Tx3 of the transfer transistor. In this case, a time point "rt2on" at which a turn-on voltage is applied to the second transfer gate Tx2 may precede a time point "rt1on" at which a turn-on voltage is applied to the first transfer gate Tx1, and should precede at least a time point "rt1off" at which a turn-off voltage is applied to the first transfer gate Tx1. However, the time point "rt2on" may be the same as the time point "rt1on". Most importantly, the time point "rt3on" at which the turn-on voltage is applied to the third transfer gate Tx3 should follow the time point "rt1off" at which the turn-off voltage is applied to the first transfer gate Tx1, and precede a time point "rt2off" at which a turn-off voltage is applied to the second transfer gate Tx2.

The method of driving the transfer transistor to allow partial overlapping of signals applied to different transfer gates may be applied in various manners to all reset and transfer operations, but the following conditions should be satisfied in order to lessen a time taken for the reset operation or an integration time.

In order to perform a second reset operation, a time point "rt1on" may directly follow the time point "rt2off" at which the turn-off voltage is applied to the second transfer gate Tx2, and a time point "rt2on" at which a turn-on voltage is applied to the second transfer gate Tx2 may directly follow a time point "rt3off" at which a turn-off voltage is applied to the third transfer gate Tx3. A time point "rt3on" at which a turn-on voltage is applied to the third transfer gate Tx3 should directly follow a time point "rt1off" at which a turn-off voltage is applied to the first transfer gate Tx1, and directly precede a time point "rt2off" at which a turn-off voltage is applied to the second transfer gate Tx2.

In order to shorten an integration time 540', a time point "tt1on" at which a turn-on voltage is applied to the first transfer gate Tx1 to perform a transfer operation may directly follow the time point "rt2off" at which a turn-off voltage is applied to the second transfer gate Tx2, which is an adjacent transfer gate, and a time point "tt2on" at which a turn-on voltage is applied to the second transfer gate Tx2 may directly follow a time point "rt3off" at which a turn-off voltage is applied to the third transfer gate Tx3. A time point "tt3on" at which a turn-on voltage is applied to the third transfer gate Tx3 to perform a transfer operation should follow time points "tt1off" and "rxoff" at which a turn-off voltage is applied to both the first transfer gate Tx1 and the reset transistor Rx and precede a time point "tt2off" at which a turn-off voltage is applied to the second transfer gate Tx2.

Figure 5C:
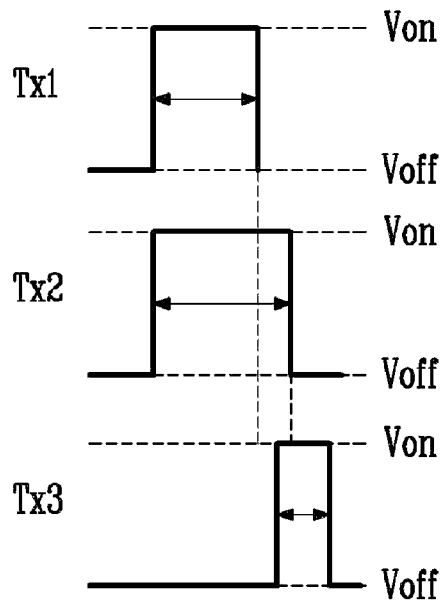

The above-described conditions may be applied to at least twice-performed reset or transfer operations, but they may be applied to a one-time reset operation to further simplify the reset operation as shown in FIG. 5C. That is, FIG. 5C illustrates a timing diagram of reset signals applied to three transfer gates, respectively, during a one-time reset operation.

Similarly, a driving method shown in FIG. 5C may be applied to a transfer operation and a transfer transistor including three or more transistors.

Figure 6:
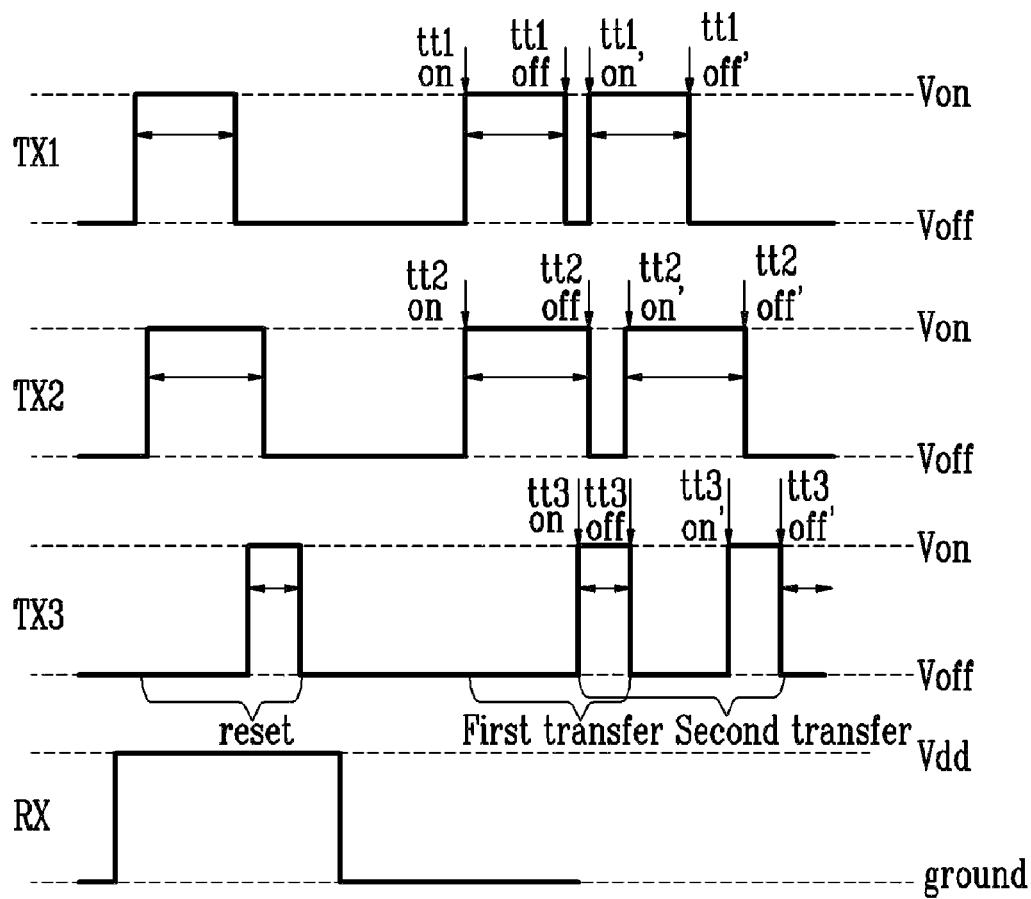
FIG. 6 is a timing diagram illustrating a method of driving a transfer transistor according to another exemplary embodiment of the present invention.

In order to obtain the above-described technical object, FIG. 6 illustrates another method of driving a transfer gate including three gates similar to the structure shown in FIG. 4.

Unlike the driving method shown in FIG. 5A, in the current embodiment, a photodiode is reset using a one-time reset operation. As described above, it is clear that the reset operations shown in FIGS. 5A and 5B can be employed. FIG. 6 illustrates a transfer operation of a transfer gate including three gates, which can be used together with the reset operation shown in FIGS. 5A and 5B. Thus, the driving method shown in FIG. 6 can inhibit an image lag, increase the well capacity of the photodiode, and increases a signal-to-noise ratio (SNR).

A one-time reset operation and twice-performed transfer operations may be performed to have the same waveform using the basic method of driving three gates as shown in FIG. 5C. Alternatively, a reset operation, a first transfer operation, and/or a second transfer operation can be performed to have different waveforms.

As illustrated in FIG. 6, during the transfer operation, a time point "tt1on" at which a turn-on voltage is applied to the first transfer gate Tx1 to perform the second transfer operation may directly follow a time point "tt2off" at which a turn-off voltage is applied to the second transfer gate Tx2, and a time point "tt2on" at which a turn-on voltage is applied to the second transfer gate Tx2 may directly follow a time point "tt3off" at which a turn-off voltage is applied to the third transfer gate Tx3. A time point "tt3on" at which a turn-on voltage is applied to the third transfer gate Tx3 should directly follow a time point "tt1off" and a time point "tt2off".

Figure 7A:
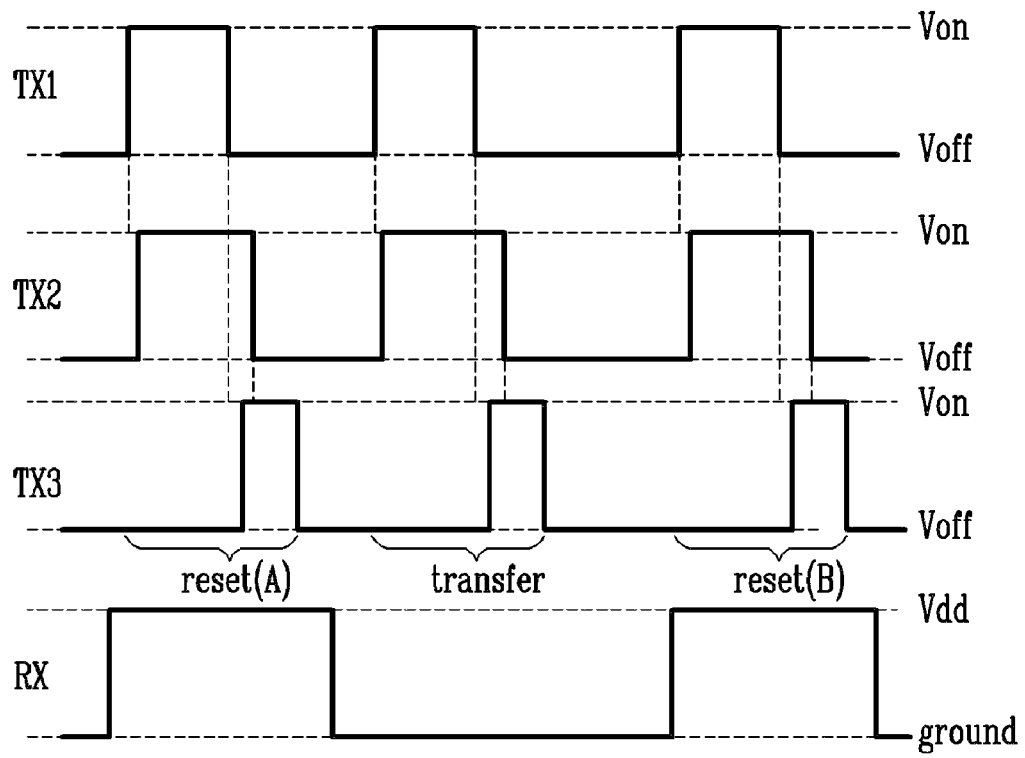
FIGS. 7A through 7C are timing diagrams illustrating a method of driving a transfer transistor according to an exemplary embodiment of the present invention.
Figure 7B:
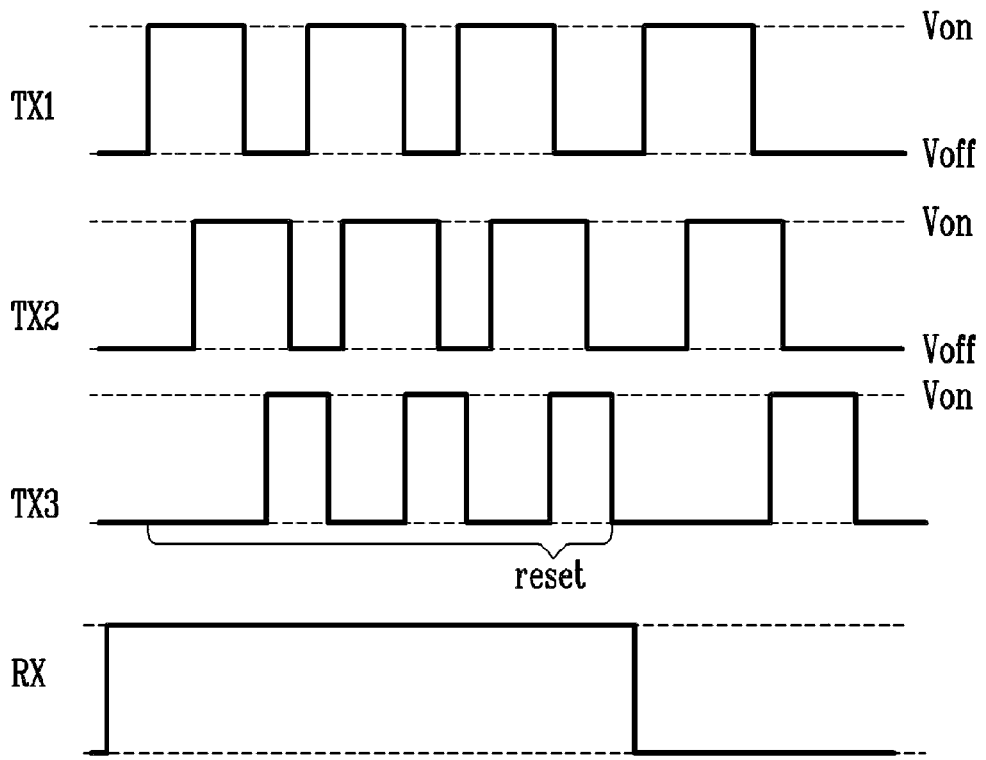
Figure 7C:
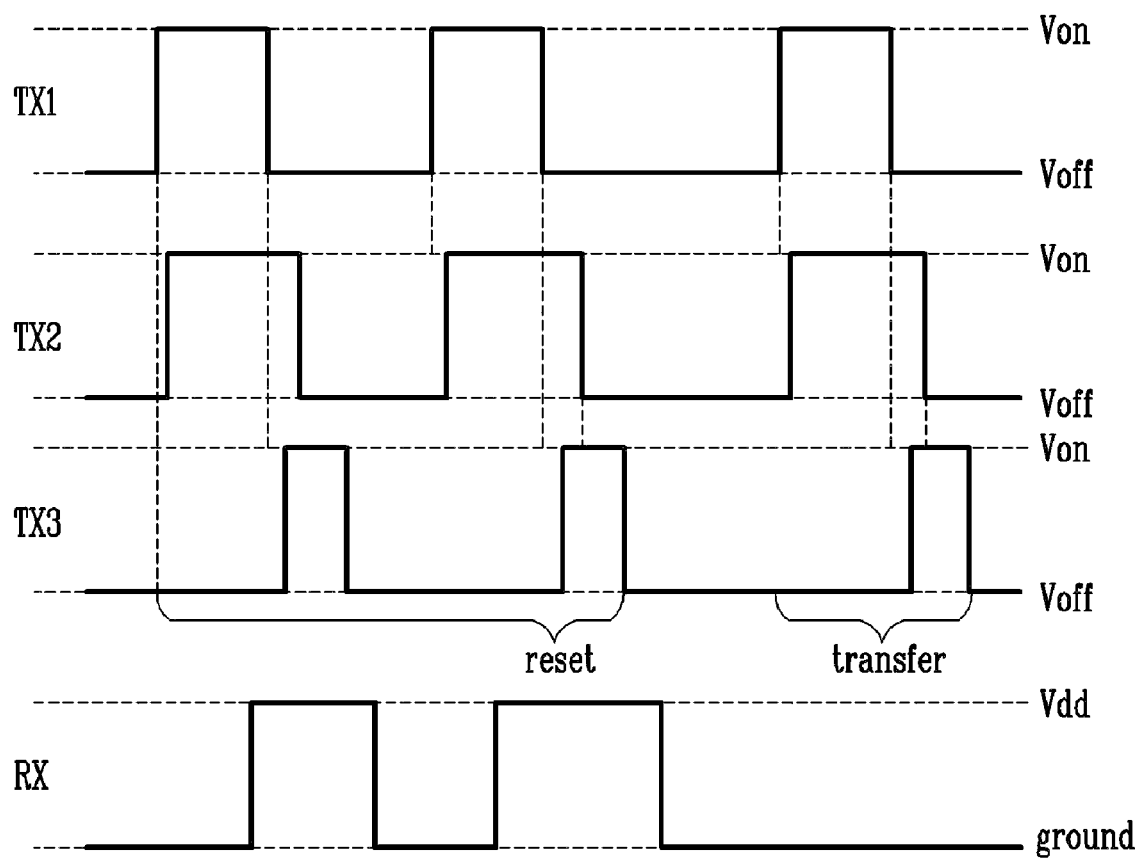

FIGS. 7A through 7C are timing diagrams illustrating three changes made to a method of driving a transfer transistor including three gates according to an exemplary embodiment of the present invention, which reflect the scope of the present invention and can obtain the technical object of the present invention. As compared with the method shown in FIG. 5A, the methods shown in FIGS. 7A through 7C can prevent a one-time turn-on period of a reset transistor from excessively increasing.

FIG. 7A illustrates a method of driving a transfer transistor in which a first reset operation, a transfer operation, and a second reset operation are sequentially performed. FIG. 7B illustrates a method of driving a transfer transistor in which a reset operation is performed twice or more. FIG. 7C illustrates a method of driving a transfer transistor in which a turn-off period of a reset transistor is included in a double reset period, and the reset transistor is turned on later than the turning-on of reset signals applied to transfer gates except a third transfer gate Tx3. The driving method shown in FIG. 7C is substantially similar to the reading of a diffusion node performed before the second reset operation shown in FIG. 7A.

In FIG. 7C, the reset transistor should be turned on before a turn-on voltage is applied to at least the third transfer gate Tx3. Thus, the reset transistor should be turned off after a turn-off voltage is applied to the third transfer gate Tx3.

Embodiment 2

An image sensor according to another exemplary embodiment of the present invention, includes a photodiode, a photosensitive pixel including a transfer transistor for transferring photocharges generated by the photodiode to a diffusion node, and a sensing control unit for controlling the voltage application time, voltage elimination time, voltage maintaining time, and applied voltage of each of transfer gates of the transfer transistor.

In the present embodiment, the transfer transistor to which the scope of the present invention can be applied includes two transfer gates. To facilitate understanding, FIG. 8 illustrates a cross-section of a transfer transistor including two transfer gates, a photodiode, and a diffusion node region according to an exemplary embodiment of the present invention.

Figure 8:
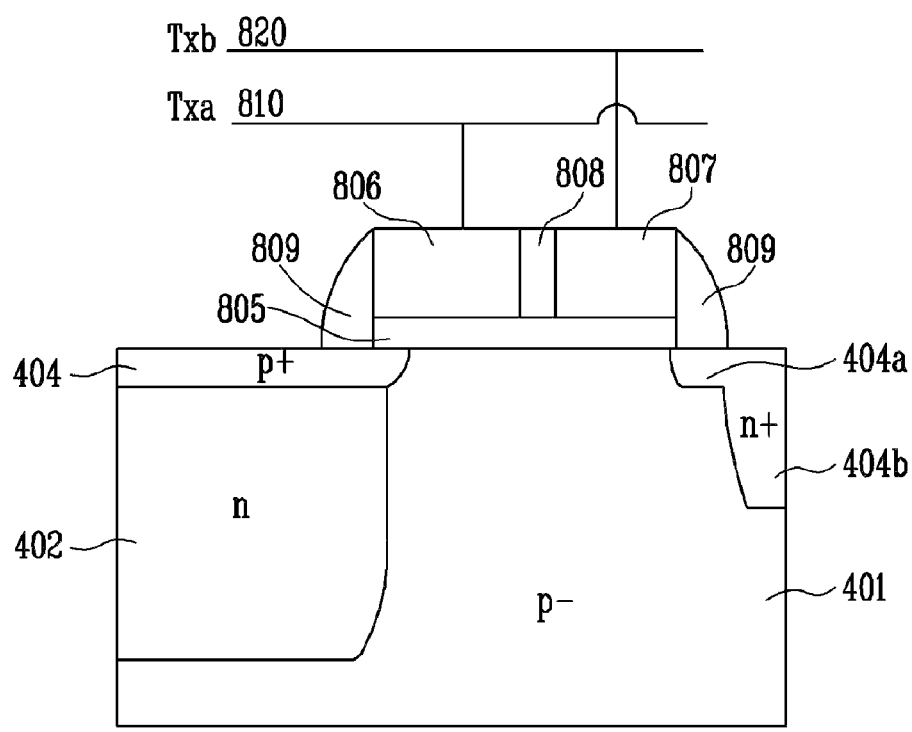
FIG. 8 is a cross-sectional view of a photodiode and a transfer transistor of a CMOS image sensor according to another exemplary embodiment of the present invention.

The cross-section of FIG. 8, which shows the structure of the transfer transistor to which a driving method according to the scope of the present invention can be applied, is generally similar to the cross-section of FIG. 4, except for the number of transfer gates forming the transfer transistor. Thus, other components of the CMOS image sensor besides the transfer transistor will not be described.

Referring to FIG. 8, the transfer transistor includes two transfer gates, which are embodied by two gate electrodes 806 and 807, an insulating material 808, which electrically insulates the gate electrodes 806 and 807 from each other, a gate insulating layer 805, and control lines 810 and 820, which are used to apply a voltage to the gate electrodes 806 and 807 and to control the applied voltage. Hereinafter, to explain the two transfer gates formed of the foregoing materials with the foregoing structures and turn-on and turn-off voltages, a transfer gate adjacent to the photodiode and a transfer gate adjacent to the diffusion node will be referred to as first and second transfer gates Txa and Txb, respectively.

As described above, the control lines 810 and 820 may be connected to a timing control circuit for controlling times taken to apply turn-on or turn-off voltages or times taken to maintain the applications of the turn-on or turn-off voltages, a switching device for switching on and off the connection of voltages, and/or a voltage regulation circuit for regulating the levels of the turn-on and turn-off voltages, so that the sensing control unit may include the timing control circuit, the switching device, and/or the voltage regulation circuit.

In the transfer transistor including two transfer gates according to the current embodiment of the present invention, similar to the transfer transistor including three transfer gates, even if there is a change in a material of a sidewall insulating layer or its forming process, a change in the dopant concentration or structure of the diffusion node, the presence or absence of expansion regions, the overlapping of a transfer gate and the diffusion node, the overlapping of transfer gates, or structural changes, desired results proposed by the present invention can be obtained.

Figure 9A:
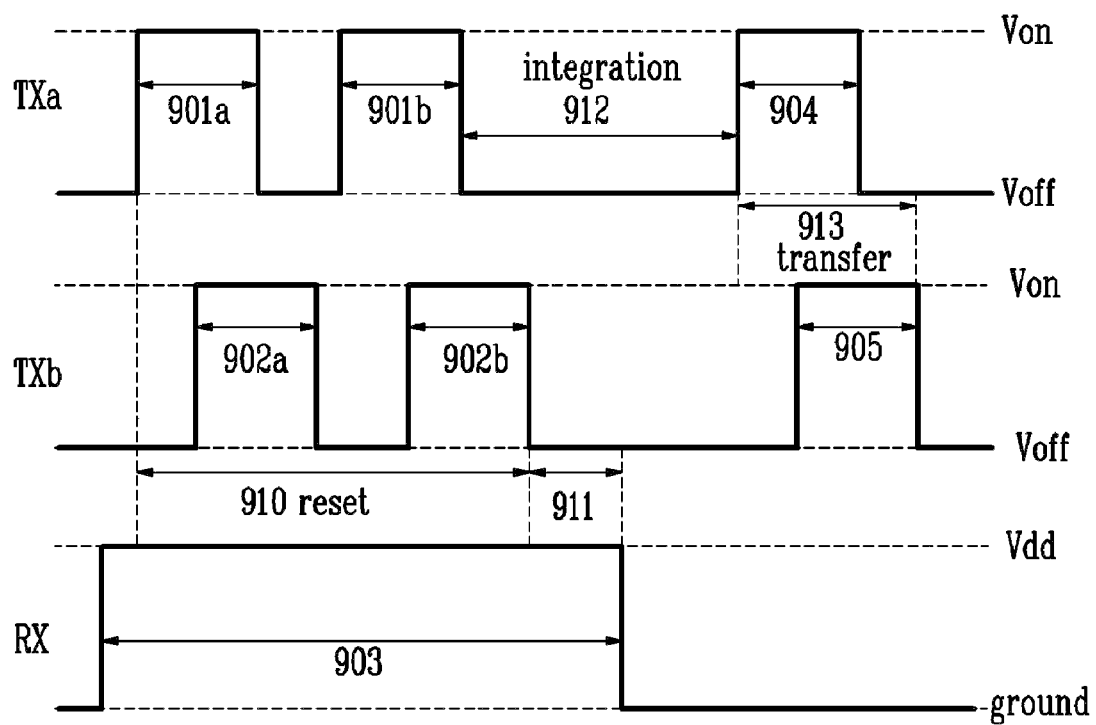
FIGS. 9A through 9C are timing diagrams illustrating a method of driving a transfer transistor according to an exemplary embodiment of the present invention.

FIG. 9A is a timing diagram illustrating a method of driving the transfer gates Txa and Txb and a reset transistor Rx of the transfer transistor shown in FIG. 8 during multiple reset operations of the photodiode, according to an exemplary embodiment of the present invention. According to the driving method shown in FIG. 9A, an image lag may be prevented and the well capacity of the photodiode may be increased.

Referring to FIG. 9A, the timing diagram may be divided into a photodiode reset period 910, a diffusion node reset period 911, an integration time 912 during which charges are accumulated due to light, and a transfer period 913 during which photocharges accumulated in the photodiode are transferred to the diffusion node.

The first transfer gate Txa provides a potential well to allow photocharges accumulated in the photodiode to move to a channel region of the first transfer gate Txa and functions to inhibit a potential barrier present between the photodiode and the channel region. The second transfer gate Txb provides a high impedance between the first transfer gate Txa and the diffusion node so that photocharges are not emitted from the diffusion node to the potential well when a turn-on voltage is applied to the first transfer gate Txa to form the potential well.

The reset operation of the photodiode may include a first reset operation 901a and 902a and a second reset operation 901b and 902b. Due to the double reset operation, the potential of the channel region of the first transfer gate Txa becomes that shown in FIG. 3A, thereby inhibiting an image lag, increasing the well capacity of the photodiode, and reducing a dark current.

Figure 9B:
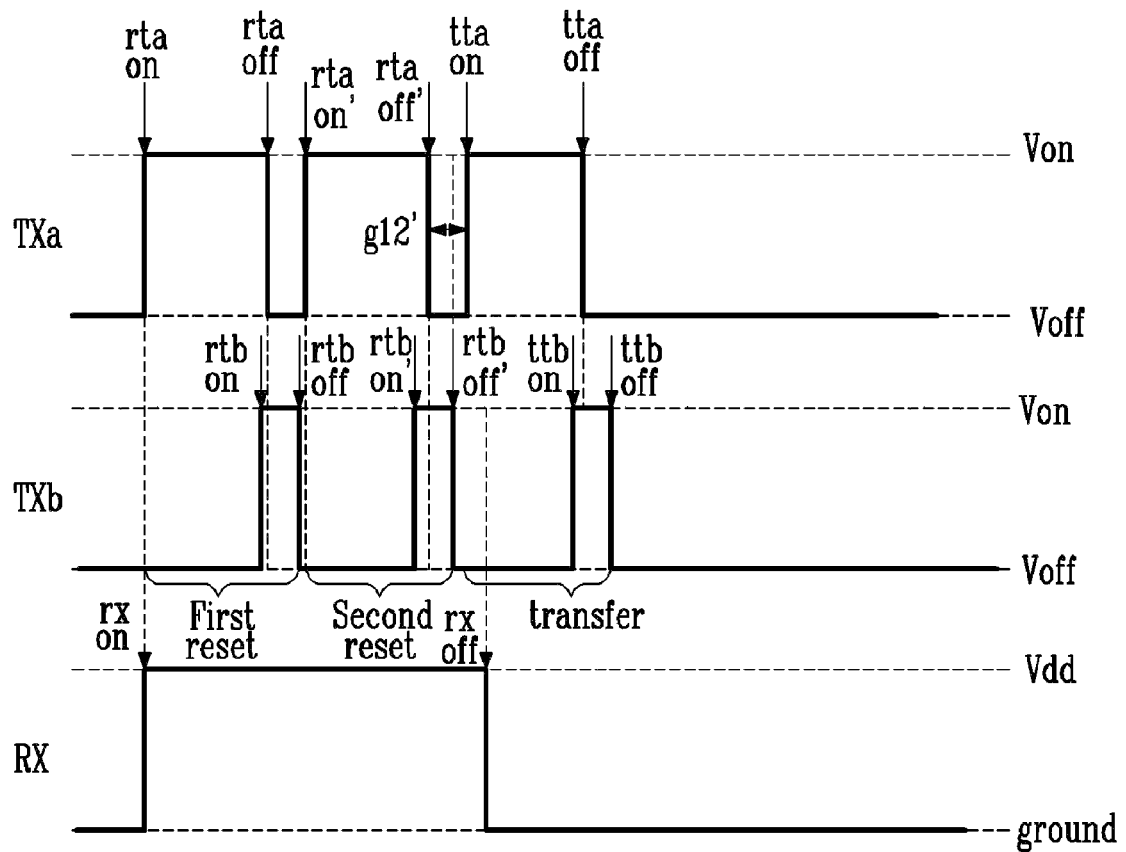

FIG. 9B is a timing diagram illustrating a method of driving the transfer transistor to shorten a reset time and an integration time. A time point "rxon" at which a turn-on voltage is applied to the reset transistor Rx to perform reset operation may be the same as a time point "rtaon" at which a turn-on voltage is applied to the transfer gate Txa, irrespective of any time point prior to a time point "rtbon" at which a turn-on voltage is applied to the second transfer gate Txb. The time point "rtbon" at which the transfer gate Txb is turned on should precede at least a time point "rtaoff" at which a turn-off voltage is applied to the first transfer gate Txa, and a time point "rtaon" at which a turn-on voltage is applied to the first transfer gate Txa to perform the second reset operation should follow a time point "rtboff" at which a turn-off voltage is completely applied to the second transfer gate Txb. Also, a time point "rtbon" at which a turn-on voltage is applied to the second transfer gate Txb to perform the second reset operation should precede a time point "rtaoff" at which a turn-off voltage is applied to the first transfer gate Txa.

A time point "ttaon" at which a turn-on voltage is applied to the first transfer gate Txa to perform the transfer operation should follow a time point "rtboff" at which a turn-off voltage is completely applied to the second transfer gate Txb irrespective of the turn-on or turn-off state of the reset transistor Rx. A time point "ttbon" at which a turn-on voltage is applied to the second transfer gate Txb to perform the transfer operation should follow a time point "rxoff" at which a turn-off voltage is applied to the reset transistor Rx, and precede a time point "ttaoff" at which a turn-off voltage is applied to the first transfer gate Txa.

During each of the first and second reset periods and the transfer period, a time for which the first transfer gate Txa is turned on may be as long as possible, and a time for which the second transfer gate Txb is turned on may be as short as possible.

Figure 9C:
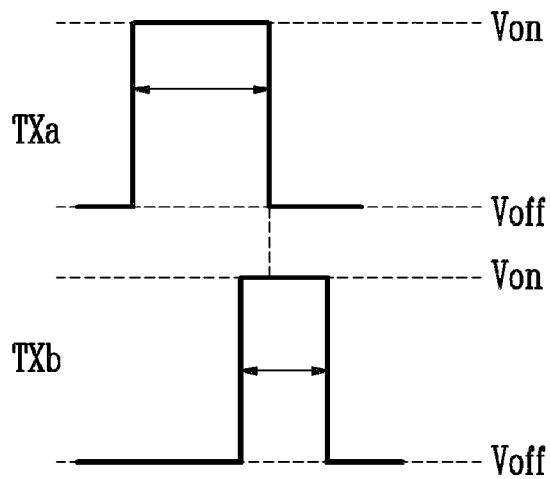

When driving the two transfer gates Txa and Txb under the above-described conditions, waveforms of reset (or transfer) signals generated to perform a one-time reset (or transfer) operation on the transfer transistor are illustrated in FIG. 9C.

Figure 10A:
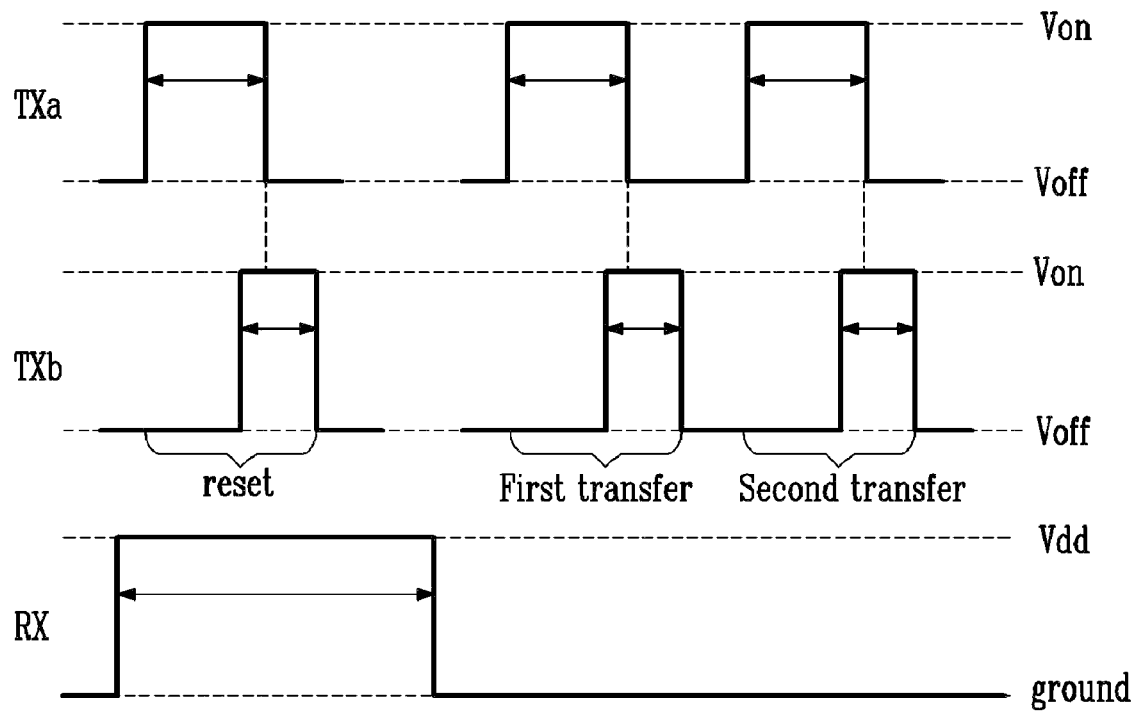
Figure 10B:
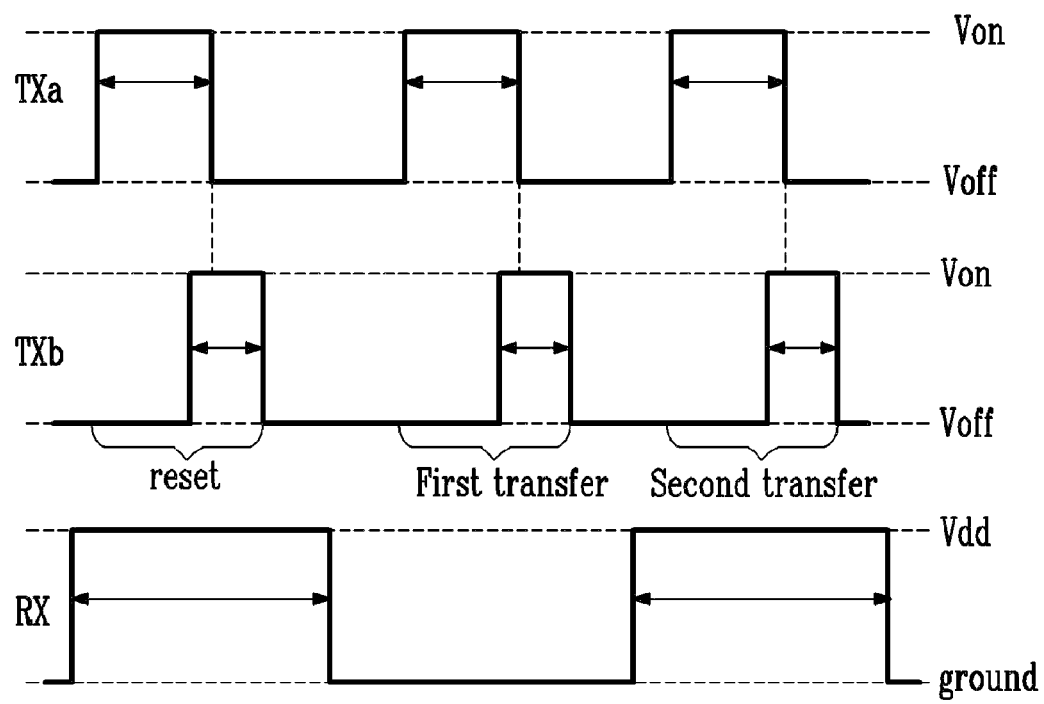

FIGS. 10A through 10C are timing diagrams illustrating three changes made to a method of driving a transfer transistor including two gates according to another exemplary embodiment of the present invention, which reflect the scope of the present invention and can obtain the technical object of the present invention.

FIG. 10A illustrates a method of driving a transfer transistor in which a one-time reset operation (or a one-time multiple reset operation) is followed by a double transfer operation. FIG. 10B illustrates a method of driving a transfer transistor in which a first reset operation, a transfer operation, and a second reset operation are sequentially performed. FIG. 10C illustrates a method of driving a transfer transistor in which a first reset period takes a different amount of time from a second reset period during a double reset operation. For example, the second reset period accounts for a large amount of time taken to perform the entire reset operation.

Although a description of transfer operation is omitted, it is clear that the transfer operation can be performed in a similar manner to the reset operation, unlike the reset operation performed on two transfer transistors as shown in FIG. 9C.

A turn-on voltage Von and a turn-off voltage Voff applied to a transfer gate will now be described in detail with reference to the timing diagrams of the first and second embodiments of the present invention. A power supply voltage, which is the highest possible operating voltage of a voltage driver circuit, may be applied as the turn-on voltage to the transfer gates Tx1 and Txa closest to the photodiode among the transfer gates. Also, a predetermined voltage between a superthreshold voltage and the power supply voltage, which is determined by the thickness of the gate insulating layer 805 and the dopant concentration of a silicon bulk disposed under the gate insulating layer 805, may be applied as a turn-on voltage to the transfer gates Tx3 and Txb closest to the diffusion node.

Further, a predetermined voltage between the superthreshold voltage and the power supply voltage, which is determined by the thickness of the gate insulating layer 805 and the dopant concentration of the silicon bulk disposed under the gate insulating layer 805, may be applied as a turn-on voltage to the transfer gate Tx2 interposed between the transfer gate closest to the photodiode and the transfer gate closest to the diffusion node. For example, the power supply voltage may be applied as the turn-on voltage to the transfer gate Tx2.

A ground voltage or a negative voltage may be applied as a turn-off voltage to some or all of the transfer gates to improve a dark current characteristic and/or the well capacity of the photodiode.

An image sensor according to exemplary embodiments of the present invention can effectively inhibit an image lag and increase the well capacity of a photodiode at a low operating voltage.

Furthermore, by changing a switching signal applied to a transfer transistor including a multiple gate structure obtained using conventional fabrication processes, the characteristics of the image sensor can be improved. Therefore, the conventional fabrication processes can be used as they are.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An image sensor comprising:
a light receiving device;
a signal conversion unit including a transfer transistor having a plurality of transfer gates, for converting photocharges generated by the light receiving device into a voltage and to output the voltage and a diffusion node to which the photocharges generated by the light receiving device are transferred by the transfer transistor, wherein a transfer gate of the plurality of transfer gates furthest away from the light receiving device overlaps the diffusion node via a boundary region; and
a sensing control means for generating at least two reset signals or at least two transfer signals applied to the transfer gates of the transfer transistor during a one-time photosensing cycle.

2. An image sensor comprising:
a light receiving device;
a signal conversion unit including a transfer transistor having three or more transfer gates for converting photocharges generated by the light receiving device into a voltage and to output the voltage; and
a sensing control means for generating at least three reset signals or at least three transfer signals applied to the transfer gates of the transfer transistor during a one-time photosensing cycle.

3. The image sensor according to claim 1, wherein the three or more transfer gates include a first transfer gate closest to the light receiving device and a last transfer gate furthest from the light receiving device.

4. The image sensor according to claim 2, wherein the last transfer gate is in an off state when the first transfer gate is in an on state.

* * * * *